United States Patent [19]
Hashimoto et al.

[11] Patent Number: 4,718,990
[45] Date of Patent: Jan. 12, 1988

[54] METHOD FOR DETECTING START OF ELECTROLESS PLATING

[75] Inventors: Shigeo Hashimoto, Hirakata; Yutaka Sugiura, Kobe, both of Japan

[73] Assignee: C. Uyemura & Co., Ltd., Osaka, Japan

[21] Appl. No.: 833,198

[22] Filed: Feb. 27, 1986

[30] Foreign Application Priority Data

Feb. 28, 1985 [JP] Japan ................................. 60-39952
May 22, 1985 [JP] Japan ................................ 60-110862

[51] Int. Cl.$^4$ .......................... G01N 27/46; B05D 3/10
[52] U.S. Cl. ................................. 204/1 T; 204/434; 427/304; 427/305
[58] Field of Search ................ 204/1 T, 434; 427/304, 427/305

[56] References Cited
U.S. PATENT DOCUMENTS

| | | | |
|---|---|---|---|
| 3,138,479 | 6/1964 | Foley | 427/305 |
| 3,438,875 | 4/1969 | Watanabe et al. | 204/435 |
| 4,055,751 | 10/1977 | Bussman et al. | 204/434 |
| 4,132,605 | 1/1979 | Tench et al. | 204/434 |
| 4,146,437 | 3/1979 | O'Keefe | 204/434 |
| 4,479,980 | 10/1984 | Acosta et al. | 204/434 |
| 4,541,902 | 9/1985 | Kinoshita et al. | 427/305 |

*Primary Examiner*—T. Tung
*Attorney, Agent, or Firm*—Birch, Stewart, Kolasch & Birch

[57] ABSTRACT

A method for detecting a start point of electroless plating, which comprises the steps of: immersing a couple of metal electrodes in an electroless plating solution; connecting the metal electrodes to a DC power supply to serve as an anode and a cathode, respectively; applying an electric current across the metal electrodes immediately before immersing an object to be electroless plated in the solution thereby causing metal deposition from the solution at the cathode to activate the same; measuring the potential difference between the activated cathode and the object to be plated; and detecting start of the electroless plating of the object from the measured value of the potential difference between the activated cathode and the object. Also disclosed is an apparatus for carrying out the method of the invention.

8 Claims, 9 Drawing Figures

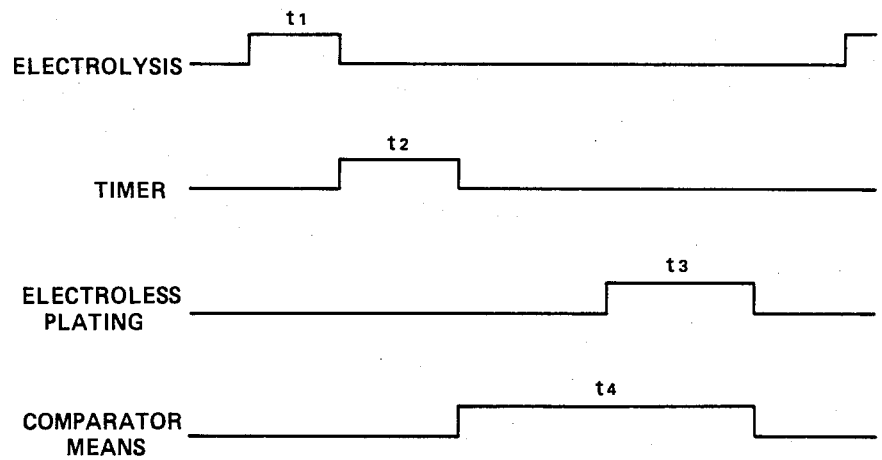
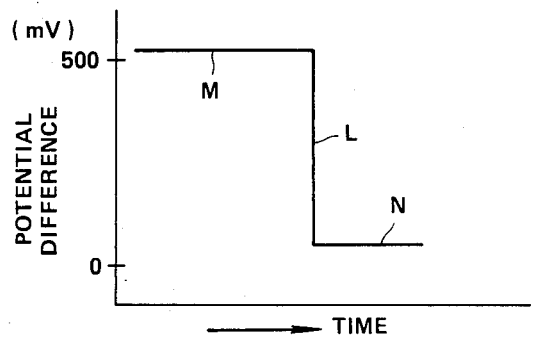
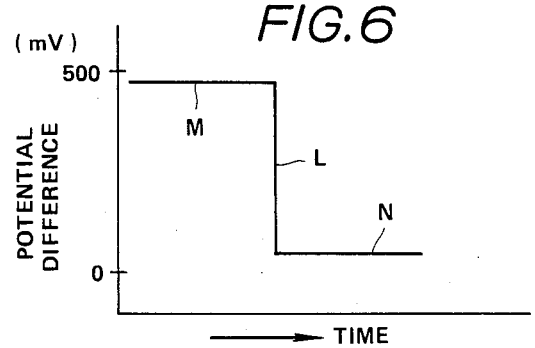

METHOD FOR DETECTING START OF ELECTROLESS PLATING

BACKGROUND OF THE INVENTION

1. Field of the Invention

The present invention relates to a method and an apparatus for detecting a start point of electroless plating such as electroless Co-P plating and electroless Co-Ni-P plating, and more particularly to a method and an apparatus for detecting the start of electroless plating, which can be suitably used for controlling the film thickness in electroless plating.

2. Description of the Prior Art

Electroless plating such as electroless Co-P plating and electroless Co-Ni-P plating has been employed widely in the production of magnetic memories or the like as means for producing magnetic films. In such electroless plating, the control of the film thickness is a matter of utmost importance since the thickness of a plated film has great influence on the physical properties of the product. Especially, in the case of a magnetic film which is formed by electroless Co-P plating or electroless Co-Ni-P plating, it is important to detect the start of plating for the control of the film thickness as the film is normally plated in a very small thickness of about 0.1 μm and within a very short time period of about 40–60 seconds. In this connection, it has been the general practice to control the film thickness by way of the plating time. When forming a film of a relatively large thickness over a long plating time, the difference in film thickness is less than 0.1 μm between the case where the plating is initiated immediately after immersion in the plating solution of an object or material to be coated and the case where the plating is initiated several seconds or ten and several seconds or several tens of seconds after immersion of the object to be coated depending upon the activeness of the plating solution. Namely, when plating thick films, no objectionable errors occur in film thickness even if the plating time is regard as the time of immersion of an object to be coated in a plating solution, that is to say, the length of time between the time point when the object is immersed in the plating solution and the time point when the object is lifted from the plating bath. Accordingly, the film thickness can be controlled on the basis of the immersion time of the object to be coated instead of the plating time, without knowing the exact starting point of plating after immersion of the object. However, in the case of the above-mentioned electroless plating in which normally a film with a thickness of about 0.1 μm is plated within a time period of about 40–60 seconds, the substitution of the plating time for the immersion time is perilous since the plating may start with a delay of serveral to several tens of seconds after immersion of an object to be coated in a plating solution. Thus, in view of the difficulty of controlling the film thickness by way of the immersion time, it is necessary to detect the exact starting point of plating and to control the plating time accordingly in order to control the film thickness appropriately.

As for the method for detecting the start of plating, although it is conceivable to use a calomel electrode or silver-silver chloride electrode as a reference (comparison) electrode thereby measuring the difference of potential from the object, this method entails troublesome problems in the maintenance and service of the electrode and the use of complicated apparatus.

SUMMARY OF THE INVENTION

Therefore, it is an object of the present invention to provide a method and an apparatus capable of detecting a start point for electroless plating in a reliable manner to permit an exact control of the plating time and film thickness, utilizing an apparatus of simple construction which involves little maintenance and service and which can be fabricated at a low cost.

In accordance with the present invention, the above-mentioned object is achieved by the method which comprises the steps of: immersing in an electroless plating solution a couple of metal electrodes, respectively connected to a DC power supply, one acting as an anode and the other as a cathode; passing a direct current across the two electrode at least immediately before immersing an object to be electroless plated in the plating solution to activate the cathode by metal deposition from the plating solution; and measuring the potential difference between the activated cathode and the coating object, thereby detecting the start of electroless plating from the measured values of potential difference.

According to the present invention, a metal electrode such as a metal wire or the like is used as a reference electrode to facilitate its maintenance and service. In addition, at least immediately before immersing an object to be electroless plated in the plating solution, metal deposition from the plating solution is imparted to the cathode the potential of which is to be compared with that of the object, thereby forming thereon a plated film of the same condition as the film which will be formed on the object upon initiation of plating after immersion in the plating solution. Therefore, the comparison for the difference of potential at the start of plating of the object is conducted always under the same condition, and the surface of the cathode is stably maintained in an activated state at the time of determining its potential difference from the object. It follows that the potential difference from the object can be always determined in a stable manner, and variations in the potential difference can be detected securely and with high sensitivity, thus, permitting the detection of the start of plating reliably and without errors.

According to the present invention, there is also provided an apparatus for carrying out the above-described method effectively, said apparatus comprising: a DC power supply; a couple of metal electrodes connected to positive and negative terminals of the DC power supply, respectively, and immersed in an electroless plating solution to serve as an anode and a cathode; an electrolysis control means adapted to produce an electrolysis command signal thereby letting the DC power supply pass a predetermined amount of current across the electrodes for a predetermined time period to cause metal deposition from the plating solution at the cathode connected to the negative terminal of the DC power supply; a non-operation control means adapted to be actuated for a predetermined time period immediately after termination of the electrolysis command signal; a potentiometer for measuring the potential difference between an object to be electroless plated and the cathode connected to the negative terminal of the DC power supply; and a comparison means adapted to be actuated immediately after de-actuation of the non-operation control means to compare the measured potential difference with a preset value, and to produce an electroless plating start signal when the measured potential difference reaches the preset value.

According to the apparatus of the invention, the potential difference between the object and cathode is compared accurately since the comparison is started by the non-operating means upon lapse of a predetermined time after termination of the electrolysis command signal which causes the metal deposition on the cathode. Namely, when the object is immersed in an electroless plating solution, especially when the object is immersed in an electroless plating solution by means of an automatic feeder, it usually takes several seconds for the upper end of the object to be immersed completely from the time point when its lower end was initially dipped in the plating solution. In the case where the comparison is made without a time lag, there are the possibilities of misoperations, detecting a start of plating upon metal deposition on part of the object before complete immersion of the object even though the plating has not yet occurred to the object as a whole. However, as described hereinbefore, the apparatus of the invention is adapted to start the comparison with a time-lag, corresponding to the time which is required for immersing the object completely in the plating solution, comparing the potentials after complete immersion of the object to detect the exact start point in a reliable manner.

Further, the apparatus of the present invention is variable with regard to the electrolytic current, time-lag and setting value of the potential difference between the cathode and the object to cope with various kinds of electroless plating.

Thus, according to the present invention, metal deposition from the plating solution is imparted to the cathode immediately before immersion of an object to be electroless plated in the plating solution to form thereon a plated film of the same condition as the film which would be formed at the start of plating of the object, putting its surface in activated state suitable for comparison. That is to say, the cathode is potentially stabilized when its potential difference from the object is measured by a potentiometer, so that the exact start point of plating can be detected from the results of measurement of the potential difference in a reliable manner. Besides, as the start point is detected after complete immersion of the object in the plating solution, the start of electroless plating can be detected with high reliability and free of errors. Thus, the apparatus of the invention is especially suitable for controlling the actual time of electroless plating and the plated film thickness, in addition to the advantages such as easiness of maintenance and service, simple construction, and low cost of manufacture.

BRIEF DESCRIPTION OF THE DRAWINGS

The above and other objects, features and advantages of the present invention will become more apparent from the following description and claims taken in connection with the accompanying drawings, in which:

FIG. 4 is a waveform diagram employed for the explanation of operations by the embodiment of FIG. 3: and FIGS. 5 to 9 are charts of potential difference between the cathode and coating object.

DESCRIPTION OF PREFERRED EMBODIMENTS

Figure 1:
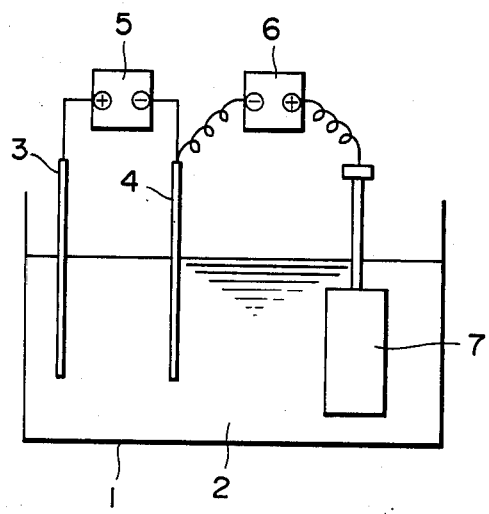
FIG. 1 is a diagrammatic view of an apparatus employed for carrying out the method of the present invention.

Referring first to FIG. 1, there is shown an example of the apparatus for carrying out the method of the present invention, in which indicated at 1 is a plating tank, at 2 is an electroless plating solution held in the tank 1, and at 3 and 4 are metal electrodes connected to positive and negative terminals of a DC power supply 5 for electrolysis and immersed in the plating solution 2. Denoted at 6 is a potentiometer with its negative terminal connected to the electrode 4 (cathode) which is connected to the negative terminal of the aforementioned DC power supply 5, and the positive terminal of the potentiometer 6 being connected to an object or material 7 to be electroless plated.

In order to carry out the method of the present invention by the use of this apparatus, electricity is applied to the electrodes (anode and cathode) at least immediately before immersing the object 7 in the plating solution 2 to plate the cathode 4. By so doing, metal is caused to deposit from the plating solution at the cathode 4 to form thereon a plated film at least immediately before immersion of the object 7, in the same condition as it would be in at the start of plating of the object 7, putting the surface of the cathode in activated state suitable for the comparison. Accordingly, the cathode 4 is potentially stabilized when its potential difference from the object 7 is measured by the potentiometer 6 to detect the start point of plating. For example, in the case where an object made of copper is immersed in an electroless Ni-P plating solution, the potential difference between the cathode 4 and the object (copper) 7 is about 500 mV before the start of plating. Upon start of plating, the potential difference drops to approximately 0 mV since metal deposition occurs on the object 7 in the same condition as on the cathode 4, immediately covering the surface of the object 7. Thus, the start point of plating can be detected clearly from this variation in potential difference.

The method of the present invention is not limited to a particular type of electroless plating solution, and suitably can be used not only for Co-P, Co-Ni-P, Ni-P and Ni-B electroless plating solutions but also for electroless copper plating solutions. In case, the method of the present invention is particularly suitable for application to electroless plating indenting to plate a thin film in a short period of time.

The object to be plated by the method of the present invention may be of any material as long as electroless plating is feasible. In addition to metals, the invention is applicable to electroless plating of ceramics or plastics having metallic catalyst nuclei such as palladium deposited on the surfaces thereof.

With regard to the metal electrodes, metal wires or rods with small surface areas are suitably used in order to reduce wasteful metal deposition at the cathode. The metal electrode for the anode is preferred to be of a material which is insoluble by electrolysis, for example, platinum or the like. There are no specific restrictions on the material of the metal electrode for the cathode, and it is possible to use various materials though it is preferable to use platinum, stainless steel or other metals which are insoluble in the plating solution.

The electricity to be applied across the metal electrodes (anode and cathode) for electrolysis is at least the minimum amount of current which is necessary for forming a plated film on the cathode. The greater the amount of current utilized, greater is the amount of metal deposited on the cathode per unit time. In order to avoid wasteful metal deposition, it is preferred to apply the current in a slight excess of the above-mentioned minimum amount, which is normally a current in the range of about 50–500 mA/dm$^2$. In this instance, the current is preferred to be applied always in a constant amount, and for this purpose the DC power supply is preferred to be a constant current power supply. Also, a constant voltage power supply can be suitably used.

The electricity can be applied to the metal electrodes either continuously or intermittently. In any event, it is necessary to apply the current immediately before immersion of an object to be plated in the plating solution to form a plated film of activated state on the cathode beforehand. Namely, by applying electricity continuously across the two electrodes (anode and cathode), the metal deposition takes place continuously at the cathode to keep it in an activated state. On the other hand, for intermittent current application, it is possible to employ various methods, for example, a method of applying current only when the object is not immersed in the plating solution, cutting the current supply while the object is in immersed state, a method of applying current only for a period of several seconds or several tens of seconds immediately before immersion of the object in the plating solution, or a method of applying current for the period from a point immediately before immersion of an object in the plating solution to a start point of plating. In this connection, from an operational standpoint, it is recommended to employ the method of continuously supplying small current. However, in the case where the physical properties of a plating film is likely to be influenced by the current which is applied across the two electrodes during the formation of the film, for example, in the case of forming a magnetic film by electroless plating, it is preferred not to apply the current while the object is immersed in the plating solution and to apply current only for a predetermined time period from a point immediately before immersion of the object.

In this manner, the current is supplied to the electrodes at least immediately before immersion of the object in the plating solution, thereby always activating the cathode to permit stable measurement of its potential difference from the object. In contrast, the potential at the surface of the cathode is unstable when the potential difference from the object is measured by the use of a single metal electrode, failing to detect the start of plating in a reliable manner.

The method of detecting the start of plating according to the present invention can be effectively used for the control of film thickness in electroless plating.

Figure 2:
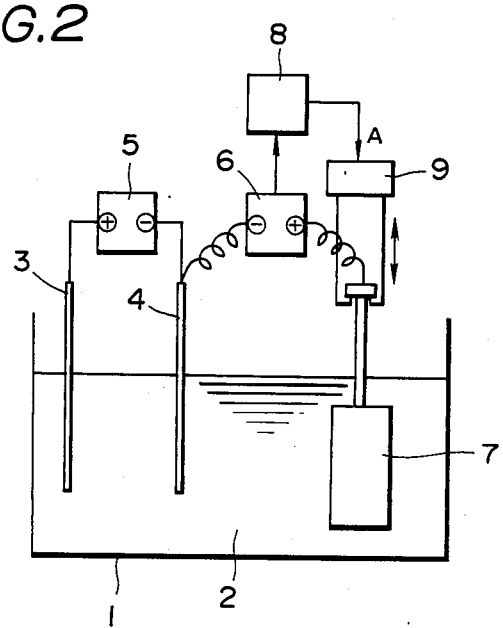
FIG. 2 is a diagrammatic view of a plating film thickness control system incorporating the apparatus of FIG. 1.

For instance, as shown in FIG. 2, the potentiometer 6 is connected to a controller 8 which incorporates a computer and in which the value of potential difference received from the potentiometer 6 is compared with a reference value which represents the start of plating. Upon detecting the start of plating of the object 7, the signal A is sent to a loader-unloader 9 of the object 7 after lapse of a predetermined time period from the time point of the detection, actuating the loader-unloader 9 to lift up the object 7 from the plating solution 2. Thus, the time period (the actual plating time) from the start of plating to the withdrawal of the object 7 from the plating solution 2 is controlled constantly, controlling the film thickness depending upon the actual plating time.

Figure 3:
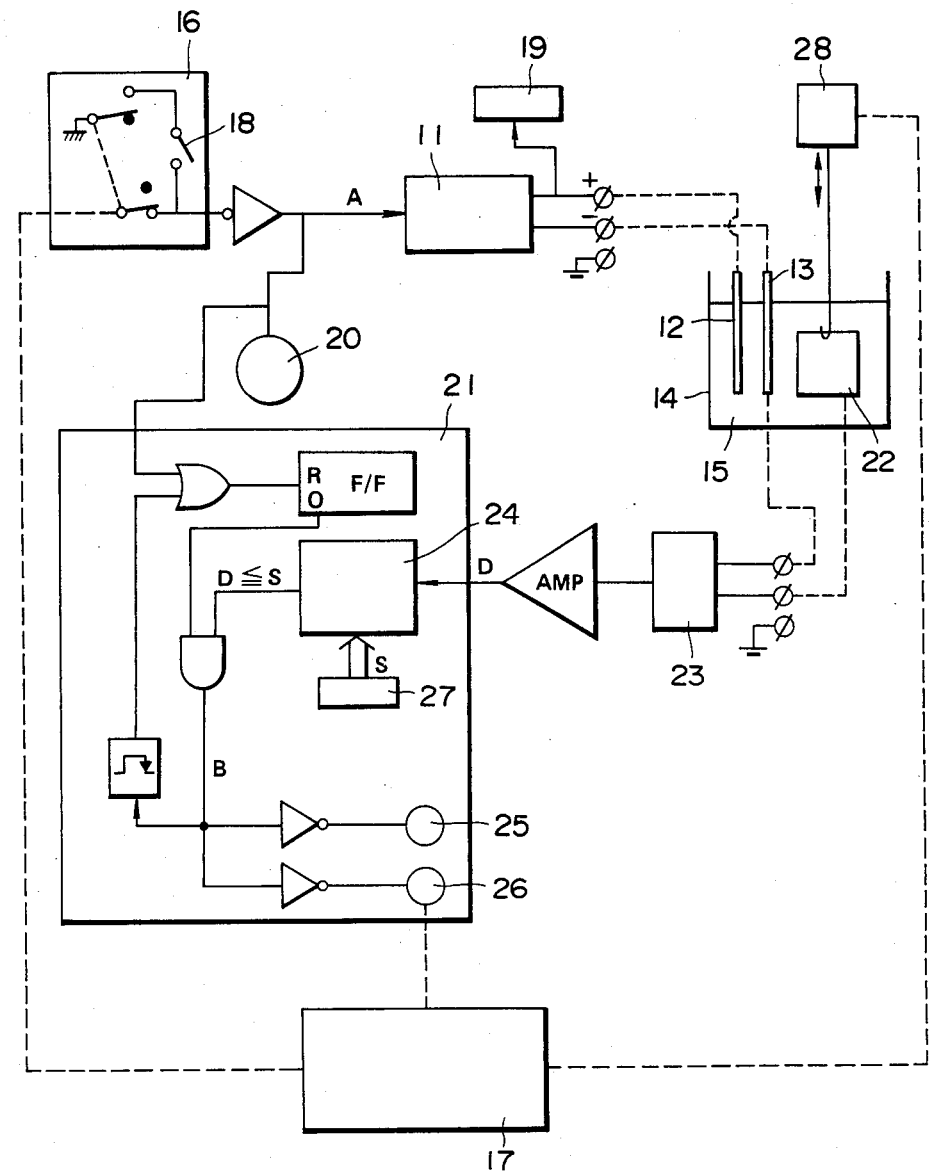
FIG. 3 is a block diagram showing a more particular embodiment of the invention.

Referring to FIG. 3, there is shown a more particular example of the system for detecting the start of electroless plating, in which indicated at 11 is a DC power supply having the positive and negative terminals thereof connected to a couple of metal electrodes 12 and 13 which are immersed in an electroless plating solution 15 in a plating tank 14. The DC power supply 11 is also connected to a computer 17 through a manual switch device 16 to apply a predetermined current across the electrodes 12 and 13 for a predetermined time period in response to an electrolysis signal A from the computer 17, causing metal deposition during that time period at the electrode 13 (cathode) which is connected to the negative terminal of the DC power supply 11. In this instance, if the switch mechanism 16 is switched to a manual position, the computer 17 is disconnected, and the electrolysis command signal A is produced by turning on a start switch 18.

The above-mentioned DC power supply 11 is preferred to be of constant current or constant voltage and has output current which is variably controllable in a predetermined range (e.g., in the range of 0–1000 mA). In this instance, the amount of current which is applied across the metal electrodes 12 and 13 for electrolysis is preferred to be slightly larger than a minimum current which can form a plated film on the cathode 13 as described hereinbefore, and normally in the range of 50–500 mA/dm$^2$. The conduction time $t_1$ is variable but normally preferred to be in the range of 1–10 seconds. The amount of applied current is displayed on an indicator panel 19.

Indicated at 20 is a timer (a non-operation control means), which is adapted to operate for a predetermined time period immediately after termination of the electrolysis command signal A, and a comparator means 21 is actuated after the timer 20 comes to a stop. The operating time $t_2$ of the timer 20 is set for a length of period which is sufficient for completely immersing the object 22 in the plating solution 15, and normally variable in the range of 0.5–20 seconds.

Further, designated at 23 is a potentiometer (or a sensor) which measures the potential difference between the cathode 13 and object 22.

The comparator means 21 becomes operable immediately after the operation of the timer 20 comes to an end as mentioned hereinbefore, the potential difference D which is measured by the potentiometer 23 being fed to a comparator 24 for comparison with a preset value S. As soon as the measured potential difference D reaches the preset value S ($D \leq S$), it issues a plating start signal B and turns on a start indicator lamp 25, sending the signal B to the computer 17 through a relay 26.

The detection of the start of plating according to the invention is based on the following principles. For example, when an object of copper is immersed in an electroless Ni-P plating solution in the manner as shown in FIG. 5, the potential difference between the cathode and the object is about 500 mV before initiation of plating, but it drops approximately to 0 mV upon initiation of plating due to metal deposition which occurs on the object and immediately covers the surface of the latter with the plating metal in the same metallic condition as on the cathode. Thus, the start of plating can be detected clearly from this variation in the potential difference. In FIG. 5, the reference character "L" denotes a state at the start of plating, "M" a state before initiation of plating reaction and "N" a state after plating reaction. Thus, by presetting the value S at or around 0 mV, the start of plating can be detected definitely from the drop of the measured potential difference D below the preset value (D≦S). It is preferred that the preset value D is variable and can be set by digital switch 27 or the like.

The computer 17 is connected to a loader-unloader 28 of the object 22, sending the afore-mentioned electrolysis command signal A to the DC power supply 11 when the object 22 is transferred to a predetermined position by the loader-unloader 28 and giving a descend command to the loader-unloader 28 to immerse the object 22 in the plating solution 15 as soon as the electrolysis command signal is turned off. Upon lapse of a predetermined time period immediately after receipt of the plating start signal B from the comparator means 21, an ascend command is given to the loader-unloader 28 to lift up the object 22 from the plating solution 15. Consequently, workpieces are always subjected to the plating for a constant time length ($t_3$) from the start of plating and the film thickness is uniformly controlled.

The operation time $t_4$ of the comparator means 21 ends at a time point when the plating start signal is turned off (at a time point when the object 22 is lifted up) as shown in FIG. 4, and its operation is continuedly held in off state until the operation of the timer 20 is stopped again. However, the comparator means 21 can be arranged to stop its operation at the time point of issue of the electrolysis command signal A or the plating start signal B whichever is suitable.

The above-described start detection system is disconnectible from the computer 17 for manual operation, in which the start of plating can be known from the turn-on of the plating start indicator lamp 25. In order to control the plating time without the above-described computer control, there may be provided a timer which is actuated by the plating start signal B to control the descending and ascending movements of the loader-unloader 27.

It is to be understood that the present invention is not limited to the above-described embodiments and various alterations or modifications can be made thereto without departing from the technical scope of the invention.

Hereafter, the invention is illustrated more particularly by the following examples.

EXAMPLE 1

A couple of platinum wires with insulation setting were immersed in an electroless Ni-P plating solution of the composition indicated below, and connected to a constant current power supply, continuously applying a small current across the platinum wires. On the other hand, a copper wire was immersed in the plating solution as an object to be electroless plated on which the electroless plating is not started only by the immersion in the plating solution, and the potential difference between the copper wire and the platinum wire of the cathode was measured and recorded on a recorder. When the potentials equalized, an iron plate was immersed in the plating solution and, after confirming occurrence of plating reaction on the iron plate, it was brought into contact with the copper wire to initiate plating. Plotted in FIG. 5 is the potential difference which was measured during the foregoing procedures, wherein the reference character "L" indicates a state at the start of plating, "M" a state before the plating reaction, and "N" a state after the plating reaction.

| Electroless Ni—P Plating Solution Composition & Plating Conditions | |
|---|---|
| NIMDEN HDX-5M (Product of C. Uyemura Co. & Ltd.) | 200 ml/l |
| NIMDEN HDX-A (Product of C. Uyemura Co. & Ltd.) | 60 ml/l |
| pH | 4.6 |
| Temperature | 90° C. |

EXAMPLE 2

Example 1 were repeated except for the use of an electroless Co-Ni-P plating solution of the composition indicated below and, as an object, a copper wire with electroless Ni-P plating beforehand. The potential difference between the object and the cathode was measured, obtaining the results as shown in FIG. 6.

| Composition of Co—Ni—P Plating Solution & Plating Conditions | |
|---|---|
| Nickel sulfate | 0.06 mol/l |
| Cobalt sulfate | 0.04 mol/l |
| Sodium hypophosphite | 0.2 mol/l |
| Ammonium sulfate | 0.1 mol/l |
| Sodium malonate | 0.3 mol/l |
| Sodium malate | 0.4 mol/l |
| Sodium succinate | 0.5 mol/l |
| pH | 9.0 |
| Temperature | 80° C. |

From the results shown in FIGS. 5 and 6, it was confirmed that the start of plating could be detected clearly by the method of the present invention.

EXAMPLE 3

Small current was continuously passed across a couple of platinum wires which were set in position by the use of insulating means. Nextly, the potential difference between the platinum wire of the cathode and a rack which hanged an object to be electroless plated and was electrically in contact with the object when the latter was put in the plating solution was sequentially monitored to detect the start point of plating at which the potential difference abruptly dropped to a small value. The results are shown in FIGS. 7 to 9.

Figure 7:
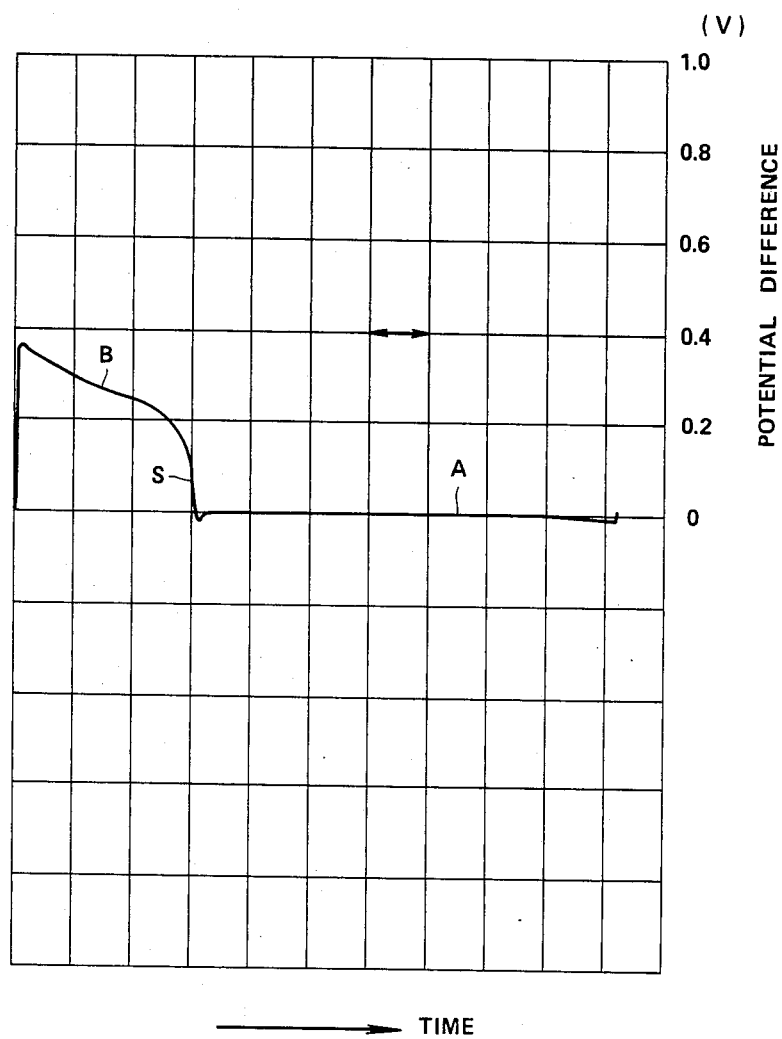
Figure 8:
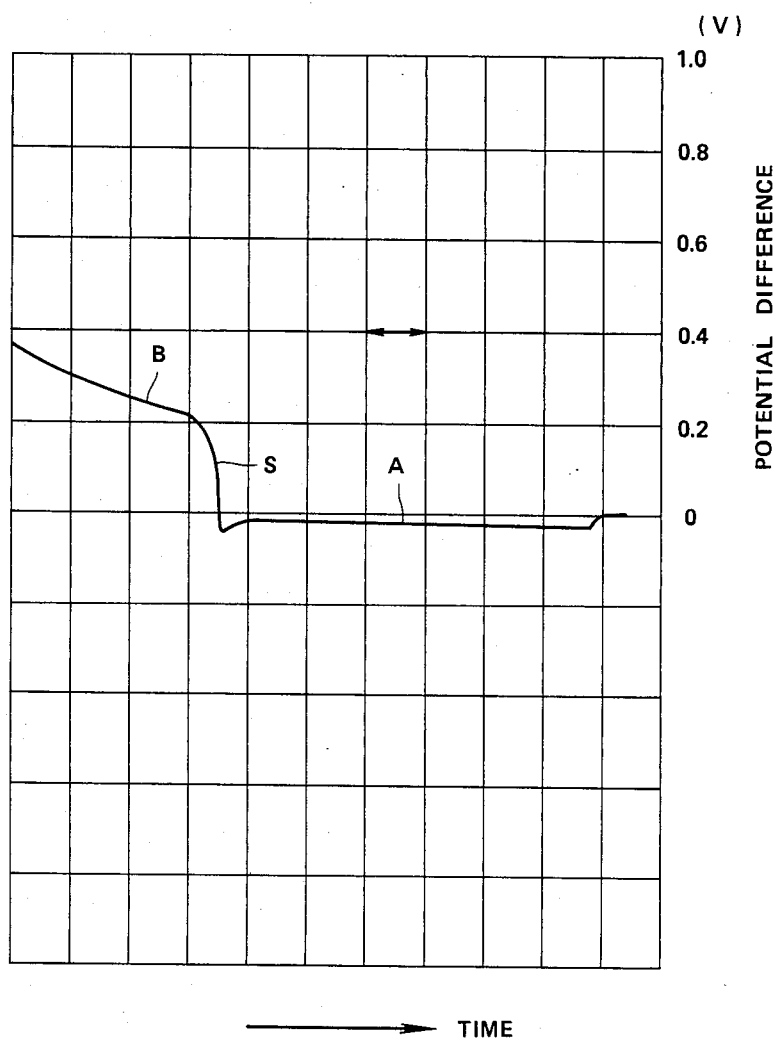
Figure 9:
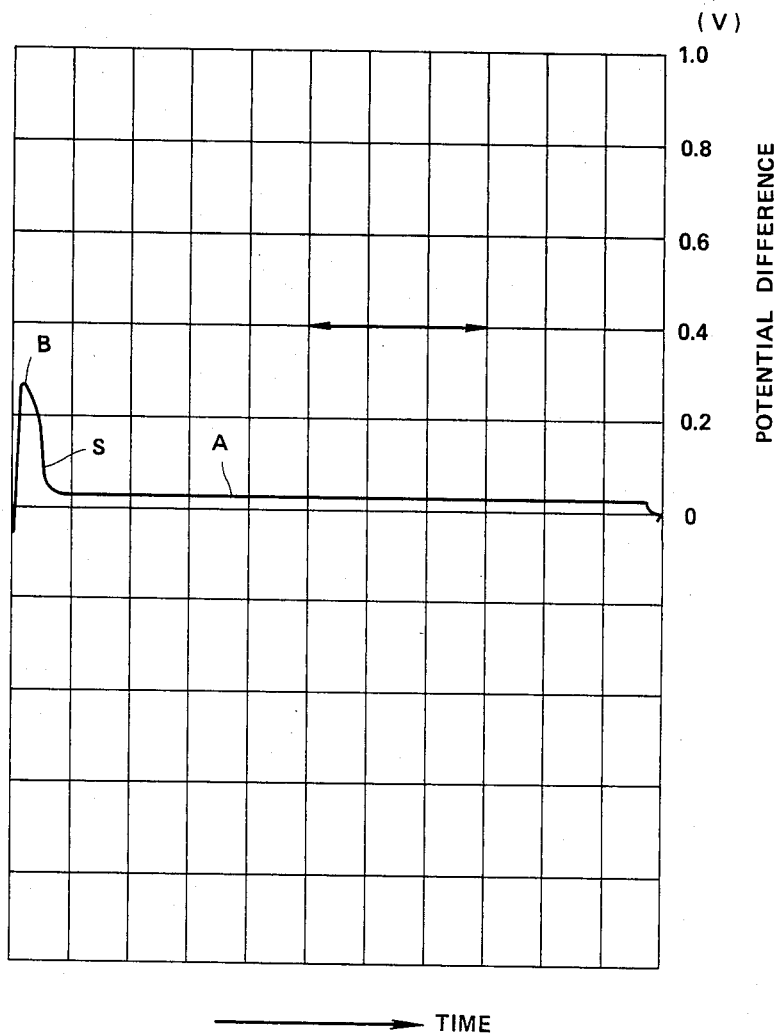

The results of FIGS. 7 and 8 are of electroless Co-Ni-P plating at 80° C. of the object consisting of an aluminum plate with electroless Ni-P plating. FIG. 7 plots the potential difference in a case where current was continuously supplied to the platinum wires for detection of the start point of plating. In the case of FIG. 8, the start of plating was detected by supplying current for a period of 20 seconds immediately before immersion of the object in the plating solution, cutting the current supply after immersion of the object. FIG. 9 plots the results of electroless Ni-P plating at 80° C. of the object consisting of an aluminum plate with plated films formed thereon beforehand by electroless Ni-P and Co-Ni-P plating.

It will be clear from the foregoing results that, according to the present invention, a start point of plating can be detected from an abrupt drop of the potential difference from the cathode sharply due to the potential stability of the cathode.

What is claimed is:

1. A method of detecting a start point of electroless plating, comprising the steps of:

immersing a couple of metal electrodes in an electroless plating solution;

connecting said metal electrodes to a DC power supply to serve as an anode and a cathode;

applying an electric current across said metal electrodes at least immediately before immersing an object to be electroless plated in said plating solution, to cause metal deposition from said plating solution at said cathode to activate the same;

measuring the potential difference between the activated cathode and said object to be plated; and detecting the start of the electroless plating of the object from the measured value of said potential difference between the activated cathode and the object.

2. The method according to claim 1, wherein the plating solution is selected from the group consisting of a Co-P electroless plating solution, a Co-Ni-P electroless plating solution, a Ni-P electroless plating solution and a Ni-B electroless plating solution.

3. The method according to claim 1, wherein the electric current applied across the metal electrodes is in the range of 50 to 500 mA/dm$^2$.

4. The method according to claim 1, wherein the electric current is applied continuously across the metal electrodes to deposit the metal from the plating solution continuously on the metal electrode serving as the cathode, thereby maintaining it in an activated state.

5. The method according to claim 1, wherein the electric current is applied across the metal electrodes only when the object is not immersed in the plating solution, cutting the current supply while the object is in immersed state.

6. The method according to claim 1, wherein the electric current is applied across the metal electrodes only for a period of several seconds or several tens of seconds immediately before immersion of the object in the plating solution.

7. The method according to claim 1, wherein the electric current is applied across the metal electrodes for a period from a point immediately before immersion of the object in the plating solution to the start point of plating.

8. The method of claim 1 wherein the object to be plated is selected from the group consisting of metals, ceramics having metallic catalyst nuclei deposited on the surface thereof and plastics having metallic catalyst nuclei deposited on the surface thereof.

* * * * *